United States Patent
Nakabayashi et al.

(10) Patent No.: US 9,041,008 B2
(45) Date of Patent: May 26, 2015

(54) SEMICONDUCTOR DEVICE AND METHOD OF MANUFACTURING THE SAME

(75) Inventors: Yukio Nakabayashi, Kanagawa (JP); Takashi Shinohe, Kanagawa (JP); Atsuko Yamashita, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 29 days.

(21) Appl. No.: 13/411,789

(22) Filed: Mar. 5, 2012

(65) Prior Publication Data
US 2012/0228637 A1   Sep. 13, 2012

(30) Foreign Application Priority Data

Mar. 10, 2011  (JP) .................................. 2011-052787
Jan. 23, 2012   (JP) .................................. 2012-010731

(51) Int. Cl.
| | | |
|---|---|---|
| H01L 29/78 | (2006.01) | |
| H01L 29/66 | (2006.01) | |
| H01L 21/04 | (2006.01) | |

(52) U.S. Cl.
CPC ........ *H01L 29/66068* (2013.01); *H01L 21/046* (2013.01); *H01L 21/0475* (2013.01); *H01L 29/7827* (2013.01)

(58) Field of Classification Search
CPC ....... H01L 29/161; H01L 29/24; H01L 29/78; H01L 29/80; H01L 29/16; H01L 29/06; H01L 27/11
USPC ............ 257/330, 77, 328, 329, 331, 332, 333
See application file for complete search history.

(56) References Cited

U.S. PATENT DOCUMENTS

| | | | | |
|---|---|---|---|---|
| 5,233,215 A | * | 8/1993 | Baliga ............................ | 257/490 |
| 6,054,752 A | * | 4/2000 | Hara et al. .................... | 257/629 |

(Continued)

FOREIGN PATENT DOCUMENTS

| | | |
|---|---|---|
| JP | 56-58267 | 5/1981 |
| JP | 2003-69042 | 3/2003 |

(Continued)

OTHER PUBLICATIONS

J. Tan, et al., "High-Voltage Accumulation-Layer UMOSFET's in 4H-SiC", IEEE Electron Device Letters, vol. 19, No. 12, Dec. 1998, 3 pages.

Office Action issued Dec. 9, 2014 in Japanese Patent Application No. 2012-010731 (with English translation).

*Primary Examiner* — Chuong A Luu

(74) *Attorney, Agent, or Firm* — Oblon, McClelland, Maier & Neustadt, L.L.P.

(57) ABSTRACT

A semiconductor device of an embodiment includes a first conductive type silicon carbide substrate having first and second main surfaces, a first conductive type silicon carbide layer formed on the first main surface, a second conductive type first silicon carbide region formed in the silicon carbide layer, and a first conductive type second silicon carbide region formed in the first silicon carbide region. The device includes a trench penetrating through the first and second silicon carbide regions, and a second conductive type third silicon carbide region formed on a bottom and a side surface of the trench. The third silicon carbide region is in contact with the first silicon carbide region, and is formed between the trench and the silicon carbide layer. In addition, the device includes a gate insulating film formed in the trench, a gate electrode, a first electrode, and a second electrode.

7 Claims, 12 Drawing Sheets

(56) References Cited

U.S. PATENT DOCUMENTS

2009/0008706 A1* 1/2009 Yedinak et al. ............... 257/328
2009/0200559 A1* 8/2009 Suzuki et al. ................. 257/77

FOREIGN PATENT DOCUMENTS

| JP | 2007-242852 | 9/2007 |
| JP | 2008-516451 | 5/2008 |

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Applications No. 2011-052787, filed on Mar. 10, 2011, and No. 2012-010731, filed on Jan. 23, 2012, the entire contents of which are incorporated herein by reference.

FIELD

Embodiments described herein relate generally to a semiconductor device and a method of manufacturing the same.

BACKGROUND

Silicon carbide (SiC) which is expected as a next-generation power semiconductor device material has physical property values such as a band gap which is three times that of silicon (Si), a breakdown electric field strength which is about ten times that of silicon, and thermal conductivity which is about three times that of silicon. If this property is utilized, it is possible to realize a power semiconductor device capable of operating at a high temperature with ultralow loss.

There are several high withstand voltage semiconductor devices using such properties of silicon carbide, but a double implantation MOSFET (hereinafter, referred to as DIMOSFET) in which a well region and a source region are formed by ion implementation is well known. Since a DIMOSFET uses a planarization process capable of forming a channel with high accuracy by an ion implantation method, manufacture thereof is easy. Since gate driving is voltage control, power of a drive circuit can be decreased. Thus, the DIMOSFET is suitable for a parallel operation.

However, a self-alignment process by thermal diffusion performed in manufacture of a silicon MOSFET cannot be used in silicon carbide. Therefore, when a channel region of a silicon nitride MOSFET is formed, a well region and a source region for determining a channel length are individually subjected to ion implantation using two masks. In order to reduce ON resistance, it is necessary to reduce resistance of a channel portion. However, the channel length is deviated due to misalignment when the channel length is defined using two masks and thus microfabrication is prevented.

In manufacture of a trench MOSFET by forming a trench by dry etching and providing a MOS channel at a sidewall thereof, a region in which the trench and a p-well region overlap becomes a channel. Thus, the channel length does not depend on alignment accuracy of the masks. Accordingly, by changing ion implantation depth of the p-well region and the $n^+$ source region, it is possible to easily realize a short channel. However, since an excessive electric field is applied to a gate insulating film of the bottom and end of the trench, there is concern about insulation breakdown of the gate insulating film.

DETAILED DESCRIPTION

A semiconductor device according to an embodiment includes a first conductive type silicon carbide substrate having first and second main surfaces, a first conductive type silicon carbide layer formed on the first main surface, a second conductive type first silicon carbide region formed in a surface portion of the silicon carbide layer, and a first conductive type second silicon carbide region formed in a surface portion of the first silicon carbide region. The semiconductor device includes a trench formed to penetrate through the first and second silicon carbide regions, and a second conductive type third silicon carbide region which is formed on a bottom and a side surface of the trench, is in contact with the first silicon carbide region, and is formed to be interposed between the trench and the silicon carbide layer. In addition, the semiconductor device includes a gate insulating film formed on the first silicon carbide region, the second silicon carbide region and the third silicon carbide region in the trench, a gate electrode formed on the gate insulating film, a first electrode formed on the second silicon carbide region, and a second electrode formed on the second main surface.

Hereinafter, embodiments will be described with reference to drawings. The drawings are schematic and shapes, relations between thicknesses and planar dimensions, and ratios of thicknesses of respective layers may be different from actual shapes, relations, and ratios. Here, although an n channel type MOSFET in which a first conductive type is an n type and a second conductive type is a p type is, for example, described herein, the invention is applicable to a p channel type MOSFET in which a first conductive type is a p type and a second conductive type is an n type, by appropriately changing dopant and the like. In the description, an "upper side" and a "lower side" denote the upper side and the lower side of the drawings, respectively.

First Embodiment

Figure 1A:
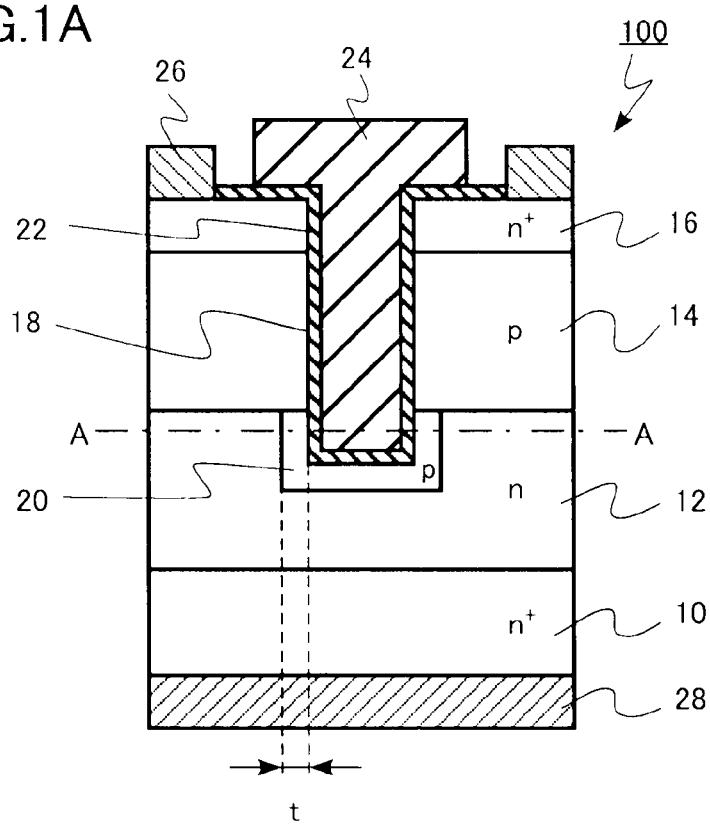
FIGS. 1A and 1B are schematic diagrams illustrating a semiconductor device according to a first embodiment.
Figure 1B:
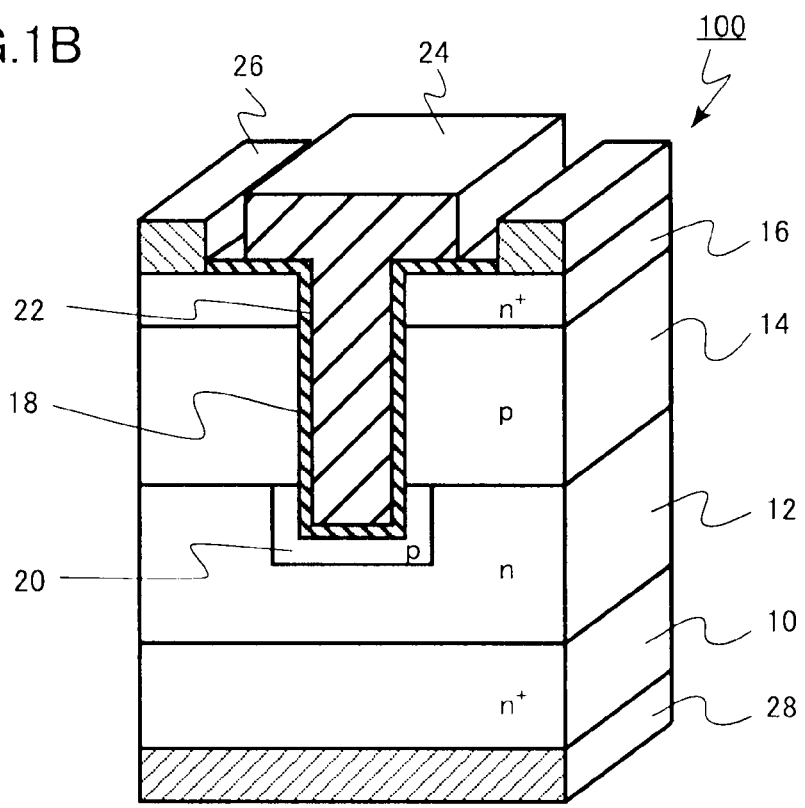

FIGS. 1A and 1B are schematic diagrams illustrating a semiconductor device according to a first embodiment. FIG. 1A is a cross-sectional view and FIG. 1B is a perspective view.

The semiconductor device 100 of the present embodiment is an n-channel type vertical MOSFET of silicon carbide (SiC). As illustrated in FIG. 1, the semiconductor device 100 includes a drain layer (silicon carbide substrate) 10 having first and second main surfaces. Here, the first main surface is a surface of the drain layer 10 disposed on the upper side of the drawing and the second main surface is a surface disposed on the lower side of the drawing. The drain layer 10 is, for example, n$^+$-type hexagonal crystal silicon carbide having an impurity concentration of about $5\times10^{18}$ to $1\times10^{19}$ cm$^3$.

On the first main surface of the drain layer (silicon carbide substrate) 10, an n-type drift layer (silicon carbide layer) 12 is formed. The drift layer 12 is, for example, n$^-$-type hexagonal crystal silicon carbide having an impurity concentration of about $5\times10^{15}$ to $2\times10^{16}$ cm$^{-3}$.

In a surface portion of the drift layer (silicon carbide layer) 12, a p-type p-well region (first silicon carbide region) 14 is formed. The p-well region 14 is, for example, p-type hexagonal crystal silicon carbide having an impurity concentration of about $1\times10^{17}$ to $5\times10^{17}$ cm$^3$.

In a surface portion of the p-well region (first silicon carbide region) 14, an n-type source region (second silicon carbide region) 16 is formed. The source region 16 is, for example, n$^+$-type hexagonal crystal silicon carbide having an impurity concentration of about $1\times10^{20}$ cm$^3$.

A trench 18 penetrating through the p-well region (first silicon carbide region) 14 and the source region (second silicon carbide region) 16 is formed.

In addition, a p-type electric field relaxation region (third silicon carbide region) 20 is formed on the bottom and side surface of the trench 18. The electric field relaxation region 20 is in contact with the p-well region 14 at the bottom of the p-well region 14, and is formed to be interposed between the trench 18 and the drift layer 12. The electric field relaxation region 20 is, for example, p-type hexagonal crystal silicon carbide having an impurity concentration of about $1\times10^{16}$ to $5\times10^{17}$ cm$^{-3}$.

A gate insulating film 22 is formed on the p-well region 14 (first silicon carbide region), the source region (second silicon carbide region) 16 and the electric field relaxation region (third silicon carbide region) 20 in the trench 18. The gate insulating film 22 is, for example, a silicon oxide film. As the gate insulating film 22, instead of the silicon oxide film, for example, a silicon nitride film or a silicon oxynitride film may be used. A lamination layer of two or more layers of the silicon oxide film, the silicon nitride film or the silicon oxynitride film may be used. As the gate insulating film 22, for example, a high dielectric film such as a tantalum oxide film or a hafnium oxide film may be used.

A gate electrode 24 is formed on the gate insulating film 22. The gate electrode 24 is, for example, n-type polycrystalline silicon. In addition, as the gate electrode 24, for example, a metal electrode such as aluminum (Al) may be used.

A source electrode (first electrode) 26 is formed on the source region 16. The source electrode 26 is, for example, formed of a lamination layer of nickel and aluminum, which is barrier metal.

A drain electrode (second electrode) 28 is formed on the second main surface of the drain layer 10. The drain electrode 28 is, for example, formed of a lamination layer of nickel and aluminum, which is barrier metal.

In addition, the semiconductor device 100 may include a p-well electrode (not illustrated) for applying a potential to the p-well region 14.

In the present embodiment, an n-type impurity is preferably, for example, nitrogen (N) or phosphorous (P), and arsenic (As) may also be used. In addition, a p-type impurity is preferably, for example, aluminum (Al), and boron (B) may also be used.

The semiconductor device 100 is a normally-off type vertical MOSFET. By applying a voltage between the source region 16 and the drain layer 10 to control a voltage applied to the gate electrode 24, current flowing between the source region 16 and the drain layer 10 is controlled.

In particular, since a high electric field is applied to the gate insulating film 22 in an off state, insulation breakdown of the gate insulating film 22 may occur or leakage current may be increased. In particular, since an electric field is concentrated in the corner of the bottom of the trench 18, insulation breakdown may occur or leakage current may be increased.

In the semiconductor device 100 of the present embodiment, the electric field applied to the gate insulating film 22 is relaxed by providing the p-type electric field relaxation region (third silicon carbide region) 20 on the bottom and side surface of the trench 18.

Figure 2:
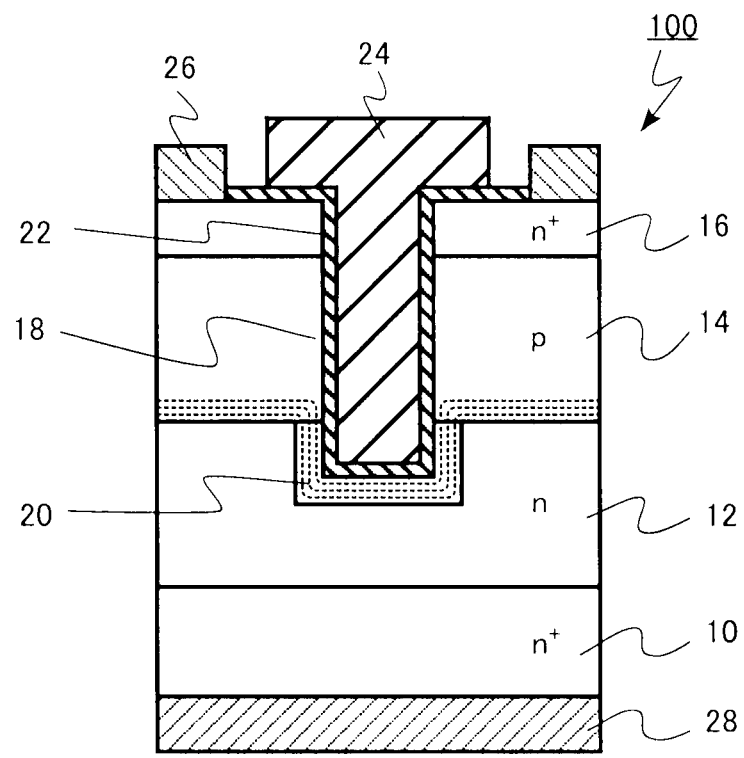
FIG. 2 is a schematic diagram illustrating growth of a depletion layer in the semiconductor device according to the first embodiment.

FIG. 2 is a schematic diagram illustrating growth of a depletion layer in the semiconductor device according to the present embodiment. In FIG. 2, in the depletion layer formed in a pn junction between the p-well region 14 and the electric field relaxation region 20 and the drift layer 12, an equipotential line of the depletion layer at the side of the p-well region 14 and the electric field relaxation region 20 is denoted by a dotted line.

In the present embodiment, the lower portion of the trench 18, that is, the bottom of the trench 18 and the side surface of the trench 18 near the bottom of the trench 18 are surrounded by the p-type electric field relaxation region 20. Accordingly, the gate insulating film 22 located beneath the trench 18 is configured so as not to be directly in contact with the drift layer 12.

In addition, the p-well region 14 and the electric field relaxation region 20 are directly in contact with each other at the bottom of the p-well region 14 such that the voltage of the p-well region 14 is applied to the electric field relaxation region 20.

With this configuration, even when a voltage is applied between the gate electrode 24 and the drain electrode 28, a depletion layer is formed in a pn junction between the p-type electric field relaxation region 20 and the drift layer 12 such that an electric field is formed in the depletion layer, and the electric field applied to the gate insulating film is decreased. Accordingly, insulation breakdown tolerance of the gate insulating film is improved and increase in leakage current is suppressed.

In the semiconductor device 100, the p-type impurity concentration of the p-type electric field relaxation region (third silicon carbide region) 20 is preferably lower than the p-type impurity concentration of the p-well region (second silicon carbide region) 14. If the p-type impurity concentration of the electric field relaxation region 20 becomes higher than that of the p-well region 14, a threshold of the MOSFET in the electric field relaxation region 20 becomes higher than that of the p-well region 14 and ON current may be reduced or the MOSFET may not be turned on.

In addition, the p-type impurity concentration of the electric field relaxation region 20 is represented by a maximum impurity concentration of the electric field relaxation region 20 of the side surface of the trench 18 and the p-type impurity concentration of the p-well region 14 is represented by a maximum impurity concentration of the p-well region 14.

Figure 3:
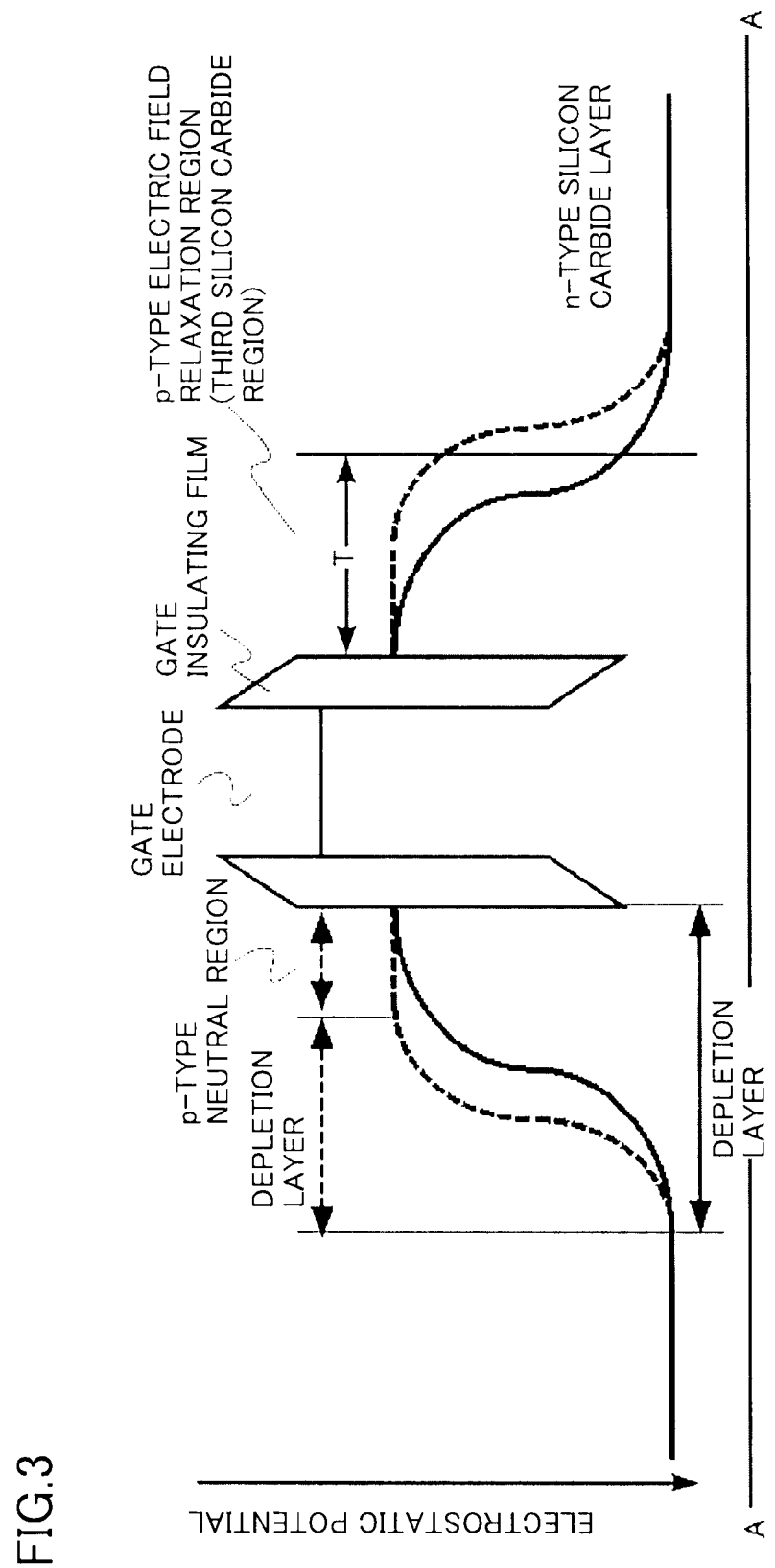
FIG. 3 is a diagram illustrating a potential distribution taken along line A-A of FIG. 1.

FIG. 3 is a diagram illustrating a potential distribution taken along line A-A of FIG. 1. A dotted line of the drawing illustrates the potential of a lower end of a conduction band in the case in which a p-type neutral region is formed in the electric field relaxation region 20 of the side surface of the trench 18. A solid line of the drawing illustrates the potential of a lower end of a conduction band in the case in which a p-type neutral region is not formed.

In the semiconductor device 100, in the p-type electric field relaxation region 20 of the side surface of the trench 18, when the MOSFET is turned on, preferably, the p-type neutral region is not formed in the side surface of the trench 18. This is because, when the p-type neutral region is formed, a potential barrier against charges flowing from a channel region formed beneath the gate insulating film 22 of the p-well region 14 to the drift layer 12 may be increased and thus ON current may be decreased.

In an ON state, in order to prevent the p-type neutral region from being formed in the electric field relaxation region 20, the thickness t (see FIG. 1A) of the p-type electric field relaxation region 20 of the side surface of the trench 18 preferably satisfies Equation 1 in a thermal equilibrium state, that is, a zero bias between the electric field relaxation region 20 and the drift layer 12.

$$t \leq (2 \in s \phi bi Nd / q Na(Na+Nd))^{1/2}$$ Equation 1

Herein, $\phi bi = (kT/q) \times \ln(NdNa/ni^2)$, Nd denotes an impurity concentration of the drift layer (silicon carbide layer) 12, Na denotes an impurity concentration of the electric field relaxation region (third silicon carbide region) 20, ni denotes intrinsic carrier density, q denotes an elementary charge, T denotes an absolute temperature, k denotes a Boltzmann constant, and $\in s$ denotes a dielectric constant of silicon carbide.

The right side of the inequality illustrates the width of the depletion layer grown from the side of the drift layer 12 to the electric field relaxation region 20. If Equation 1 is satisfied in the thermal equilibrium state, even when a bias voltage is applied between the electric field relaxation region 20 and the drift layer 12, the depletion layer is further grown. Thus, it is assured that the p-type neutral region is not formed.

In addition, Nd represents the maximum impurity concentration of the drift layer (silicon carbide layer) 12 and Na represents the maximum impurity concentration of the electric field relaxation region (third silicon carbide region) 20 at the side surface of the trench.

As described above, according to the semiconductor device 100 of the present embodiment, by providing the p-type electric field relaxation region 20 beneath the trench 18, the depletion layer is formed in a pn junction between the electric field relaxation region 20 and the drift layer 12. Accordingly, the electric field applied to the gate insulating film 22 is reduced as compared to the case in which the electric field relaxation region 20 is not provided. Therefore, the withstand voltage of the gate insulating film 22 is improved and the leakage current of the gate insulating film 22 is also reduced. Reliability of the gate insulating film 22 is also improved.

Second Embodiment

The present embodiment is an example of the method of manufacturing the semiconductor device 100 of the first embodiment. FIGS. 4 to 8 are cross-sectional views illustrating the method of manufacturing the semiconductor device of the present embodiment. Hereinafter, the present embodiment will be described with reference to FIGS. 4 to 8. The overlapped portion with the first embodiment will not be repeated.

Figure 4:
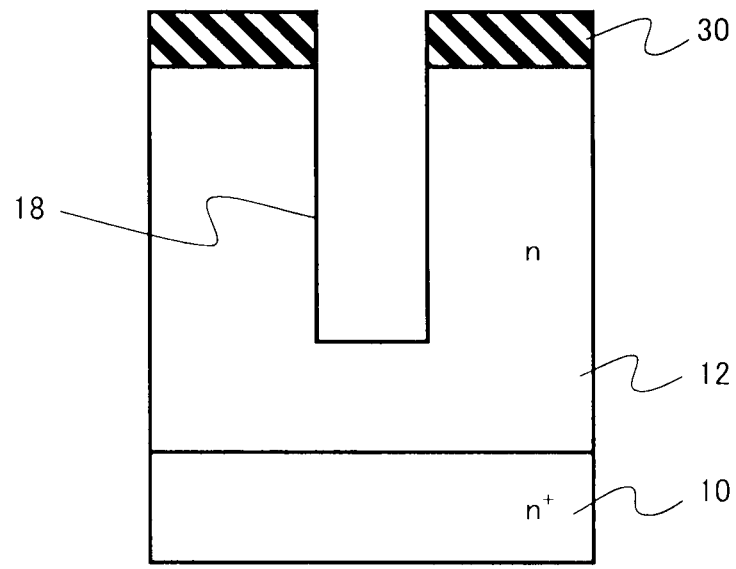
FIG. 4 is a cross-sectional view illustrating a method of manufacturing a semiconductor device according to a second embodiment.

First, as illustrated in FIG. 4, an n-type drift layer (silicon carbide layer) 12 is formed on a first main surface of an n-type silicon carbide substrate 10 having first and second main surfaces by epitaxial growth. The n-type silicon carbide substrate 10 becomes a drain layer 10. The drift layer 12 has, for example, a thickness of about 5 to 10 μm.

For example, a mask material 30 of a silicon nitride film is deposited and patterned on the n-type drift layer (silicon carbide layer) 12. A trench 18 is formed using this mask material 30 as a mask, for example, by a reactive ion etching (RIE) method.

Figure 5:
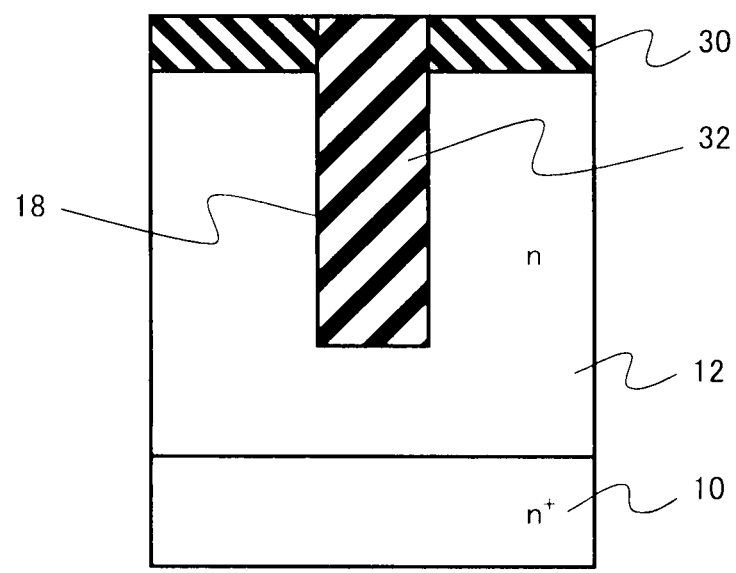
FIG. 5 is a cross-sectional view illustrating the method of manufacturing the semiconductor device according to the second embodiment.

Next, as illustrated in FIG. 5, a buried material 32 having a low ion prevention function upon ion implantation as compared to silicon carbide, for example, a silicon oxide film is buried in the trench 18. In addition, if the buried material has the low ion prevention function upon ion implantation as compared to silicon carbide, a buried material other than the silicon oxide film may be used.

Figure 6:
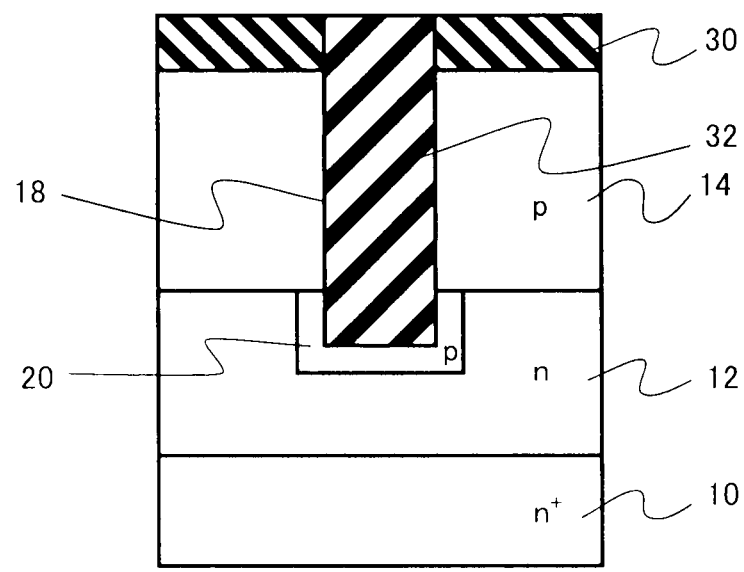
FIG. 6 is a cross-sectional view illustrating the method of manufacturing the semiconductor device according to the second embodiment.

Next, as illustrated in FIG. 6, p-type impurities, for example, aluminum (Al) are ion-implanted into the drift layer (silicon carbide layer) 12 so as to form a p-well region (first silicon carbide region) 14. An ion implantation condition is set such that the depth of the p-well region 14 is shallower than that of the trench 18.

Ion implantation is preferably performed at a high temperature of 300° C. to 600° C. such that crystalline of silicon carbide does not deteriorate. Ion implantation for forming the p-well region 14 may be performed several times by changing the depth.

Upon ion implantation, the buried material having the low ion prevention function upon ion implantation as compared to silicon carbide is buried in the trench 18. Thus, p-type impurities are introduced into a region deeper than the trench 18 in the vicinity of the trench 18. Accordingly, simultaneously with and in a manner of being self-aligned with the p-well region (first silicon carbide region) 14, a p-type electric field relaxation region (third silicon carbide region) 20 is formed. The electric field relaxation region 20 is formed in the bottom and side surface of the trench 18, is in contact with the p-well region (first silicon carbide region) 14, and is interposed between the trench 18 and the drift layer (silicon carbide layer) 12.

In addition, introduction of the p-type impurities is preferably performed by oblique ion implantation such that the p-type electric field relaxation region 20 is formed in the side surface of the lower portion of the trench 18 with a sufficient thickness and concentration.

The thickness or concentration of the electric field relaxation region 20 can be controlled, for example, by adjusting the amount of the buried material 32 in the trench 18. For example, if the thickness of the electric field relaxation region 20 is desired to be increased and the concentration thereof is desired to be increased under the same ion implantation condition, ion implantation is performed after removing the buried material 32 of the upper portion of the trench 18 by an etch-back process.

Figure 7:
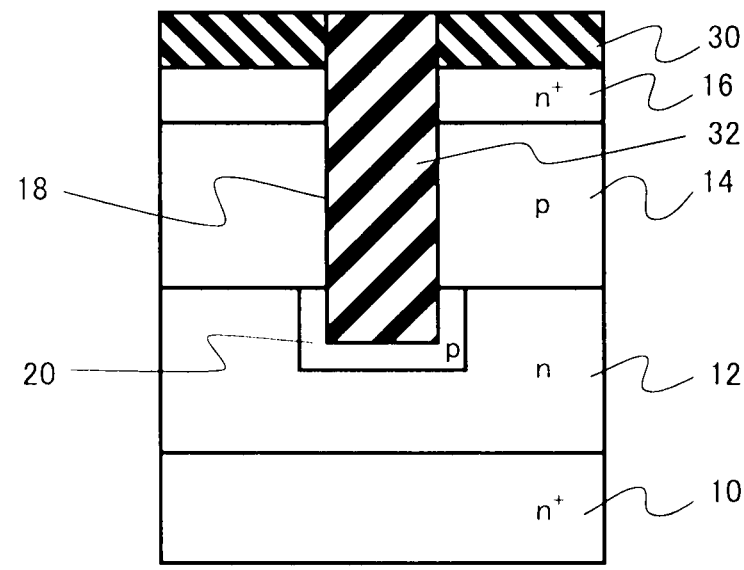
FIG. 7 is a cross-sectional view illustrating the method of manufacturing the semiconductor device according to the second embodiment.

Next, as illustrated in FIG. 7, n-type impurities, for example, nitrogen (N) are ion-implanted into the drift layer (silicon carbide layer) 12 so as to form an n-type source region (second silicon carbide region) 16 shallower than the p-well region (first silicon carbide region) 14. A difference in depth between the p-well region 14 and the source region 16 becomes a channel length of the semiconductor device 100.

Figure 8:
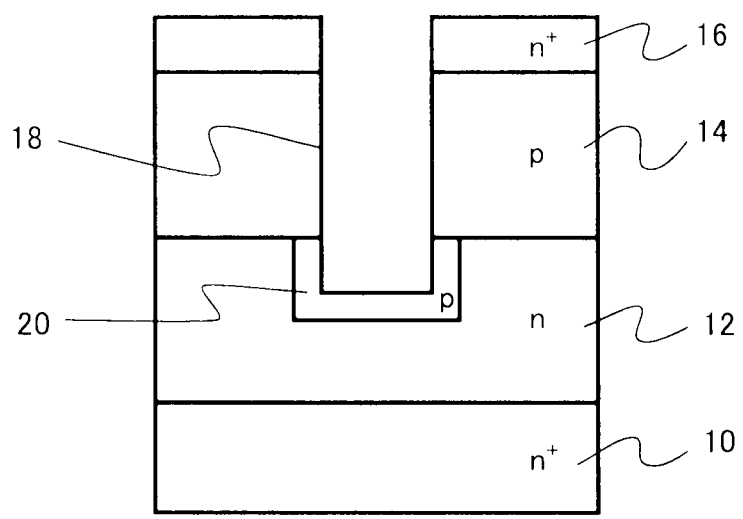
FIG. 8 is a cross-sectional view illustrating the method of manufacturing the semiconductor device according to the second embodiment.

Next, as illustrated in FIG. 8, the mask material 30 and the buried material 32 are stripped, for example, by wet etching. In addition, for example, an annealing process is performed at a temperature of 1700° C. to 1900° C. so as to activate impurities introduced by ion implantation.

Thereafter, for example, a gate insulating film 22 of a silicon oxide film is formed in the trench 18, for example, by a thermal oxidation method. In addition, polycrystalline silicon is deposited and patterned on the gate insulating film 22, for example, by a CVD method so as to form a gate electrode 24.

In addition, for example, after forming a protective insulating film (not illustrated), a contact hole is formed in the protective insulating film on the source region 16 (second silicon carbide region). In addition, a source electrode (first electrode) 26 is formed on the source region 16 (second silicon carbide region). A drain electrode (second electrode) 28 is formed on the second main surface of the drain layer 10.

By the above manufacturing method, the semiconductor device 100 illustrated in FIGS. 1A and 1B is manufactured. According to the method of manufacturing the semiconductor device of the present embodiment, the p-type electric field relaxation region (third silicon carbide region) 20 of the semiconductor device 100 illustrated in FIGS. 1A and 1B may be formed in few process steps in a self-aligned manner. Accordingly, it is possible to easily manufacture the semiconductor device 100 in which the withstand voltage of the gate insulating film 22 is improved, leakage current of the gate insulating film 22 is reduced, and reliability of the gate insulating film 22 is improved.

In addition, according to the method of manufacturing the semiconductor device of the present embodiment, the n-type region having the uniform concentration is etched so as to form the trench 18. Accordingly, it is possible to suppress roughness of the side surface of the trench 18, improve reliability of the gate insulating film 22, and improve stability of a threshold due to suppression of mobility deterioration in a channel region.

Third Embodiment

The semiconductor device of the present embodiment is different from the first embodiment in that an electric field relaxation region is of an n type and is formed in an upward convex shape between the bottom of a trench and a drift layer in contact with the drift layer. Hereinafter, the overlapped description with the first embodiment will be partially omitted.

Figure 9A:
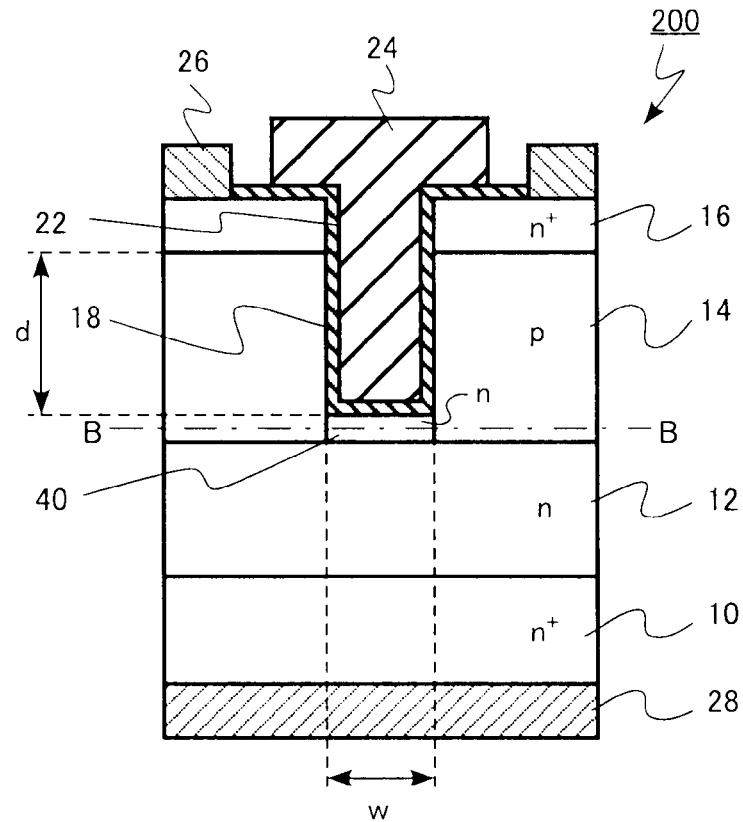
FIGS. 9A and 9B are schematic diagrams illustrating a semiconductor device according to a third embodiment.
Figure 9B:
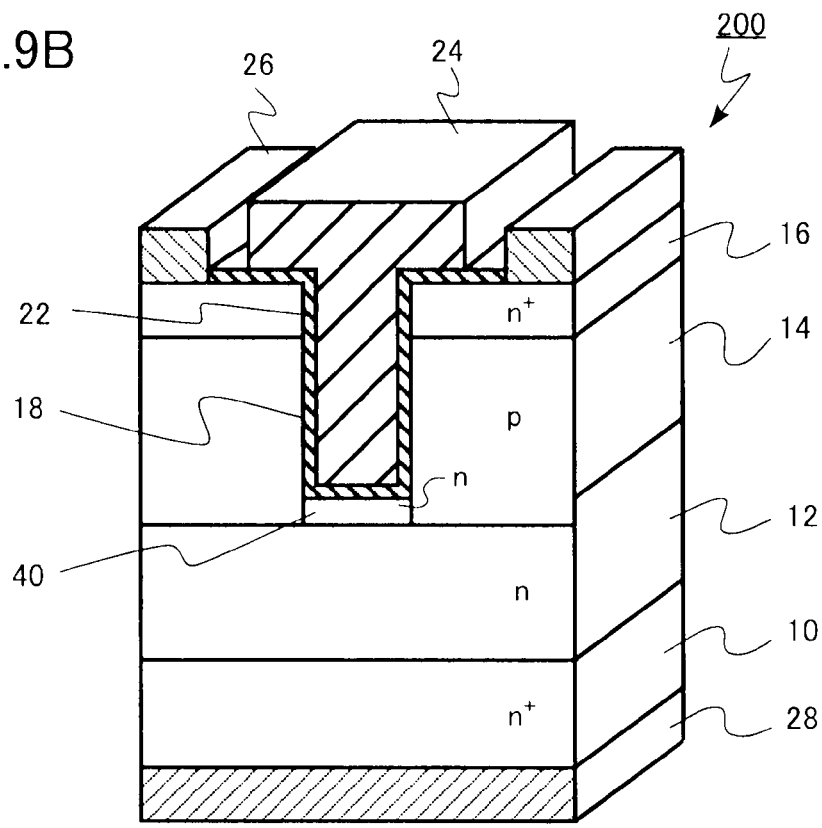

FIGS. 9A and 9B are schematic diagrams illustrating a semiconductor device according to a third embodiment. FIG. 9A is a cross-sectional view and FIG. 9B is a perspective view.

The semiconductor device 200 of the present embodiment is an n-channel type vertical MOSFET of silicon carbide (SiC). As illustrated in FIGS. 9A and 9B, the semiconductor device 200 includes a drain layer (silicon carbide substrate) 10 having first and second main surfaces. Here, the first main surface is a surface of the drain layer 10 disposed in the upper side of the drawing and the second main surface is a surface disposed in the lower side of the drawing. The drain layer 10 is, for example, n$^+$-type hexagonal crystal silicon carbide having an impurity concentration of about $5\times10^{18}$ to $1\times10^{19}$ cm$^{-3}$.

On the first main surface of the drain layer (silicon carbide substrate) 10, an n-type drift layer (silicon carbide layer) 12 is formed. The drift layer 12 is, for example, n-type hexagonal crystal silicon carbide having an impurity concentration of about $5\times10^{15}$ to $2\times10^{16}$ cm$^3$.

On the front surface of the drift layer (silicon carbide layer) 12, a p-type p-well region (first silicon carbide region) 14 is formed. The p-well region 14 is, for example, p-type hexagonal crystal silicon carbide having an impurity concentration of about $1\times10^{17}$ to $5\times10^{17}$ cm$^3$.

On the front surface of the p-well region (first silicon carbide region) 14, an n-type source region (second silicon carbide region) 16 is formed. The source region 16 is, for example, n$^+$-type hexagonal crystal silicon carbide having an impurity concentration of about $1\times10^{20}$ cm$^3$.

A trench 18 penetrating through the source region (second silicon carbide region) 16 is formed. The trench 18 is formed to be shallower than the p-well region (first silicon carbide region) 14.

In addition, an n-type electric field relaxation region (third silicon carbide region) 40 is formed beneath the trench 18. The electric field relaxation region 40 is formed to be interposed between the bottom of the trench 18 and the drift layer (silicon carbide layer) 12 such that the side surfaces of the electric field relaxation region 40 are interposed by the p-well region (first silicon carbide region) 14. The electric field relaxation region 40 are interposed by the p-well region (first silicon carbide region) 14 from sides of the electric field relaxation region 40.

By providing the n-type electric field relaxation region 40 in contact with the upper side of the n-type drift layer 12, the n-type region protrudes on the bottom of the trench in an upward convex shape. The electric field relaxation region 40 is, for example, n$^+$-type hexagonal crystal silicon carbide having an impurity concentration of about $5\times10^{15}$ to $2\times10^{16}$ cm$^{-3}$.

A gate insulating film 22 is formed on the p-well region 14 (first silicon carbide region), the source region (second silicon carbide region) 16 and the electric field relaxation region (third silicon carbide region) 40 in the trench 18. The gate insulating film 22 is, for example, a silicon oxide film. As the gate insulating film 22, instead of the silicon oxide film, for example, a silicon nitride film or a silicon oxynitride film may be used. A lamination layer of two or more layers of the silicon oxide film, the oxide nitride film or the silicon oxynitride film may be used. As the gate insulating film 22, for example, a high dielectric film such as a tantalum oxide film or a hafnium oxide film may be used.

A gate electrode 24 is formed on the gate insulating film 22. The gate electrode 24 is, for example, n-type polycrystalline silicon. In addition, as the gate electrode 24, for example, a metal electrode such as aluminum (Al) may be used.

A source electrode (first electrode) 26 is formed on the source region 16. The source electrode is, for example, formed of a lamination layer of nickel and aluminum, which is barrier metal.

A drain electrode (second electrode) 28 is formed on the second main surface of the drain layer 10. The drain electrode 28 is, for example, formed of a lamination layer of nickel and aluminum, which is barrier metal.

In addition, the semiconductor device 200 may include a p-well electrode (not illustrated) for supplying a potential to the p-well region 14.

In the present embodiment, an n-type impurity is preferably, for example, nitrogen (N) or phosphorous (P), and arsenic (As) may also be used. In addition, a p-type impurity is preferably, for example, aluminum (Al), and boron (B) may also be used.

The semiconductor device 200 is a normally-off type vertical MOSFET. By applying a voltage between the source region 16 and the drain layer 10 to control a voltage applied to the gate electrode 24, current flowing between the source region 16 and the drain layer 10 is controlled.

In particular, since a high electric field is applied to the gate insulating film 22 in an off state, insulation breakdown of the gate insulating film 22 may occur or leakage current may be increased. In particular, since an electric field is concentrated in a corner of the bottom of the trench 18, it is concerned that insulation breakdown may occur or leakage current may be increased.

In the semiconductor device 200 of the present embodiment, the electric field applied to the gate insulating film 22 is relaxed by providing the n-type electric field relaxation region (third silicon carbide region) 40 between the bottom of the trench 18 and the drift layer 12.

Figure 10:
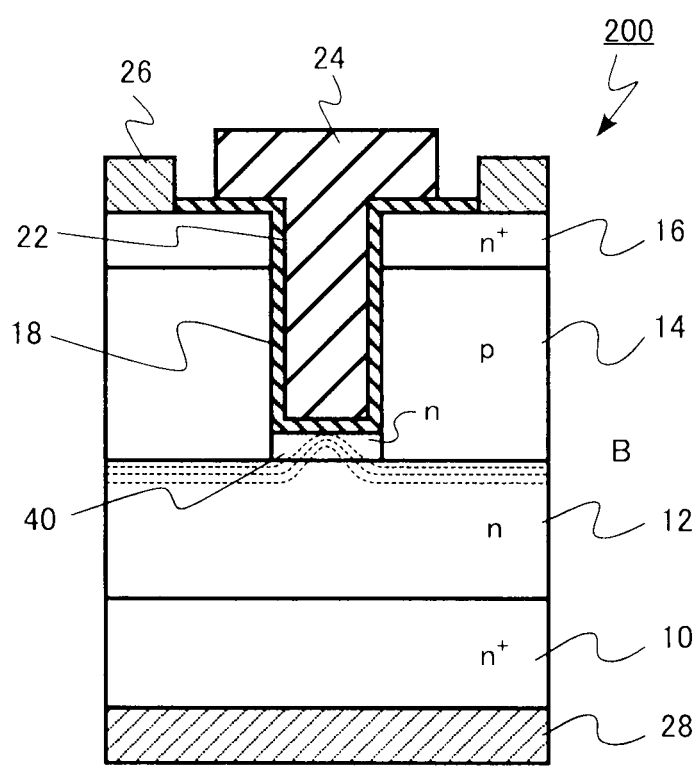
FIG. 10 is a schematic diagram illustrating growth of a depletion layer in the semiconductor device according to the third embodiment.

FIG. 10 is a schematic diagram illustrating growth of a depletion layer in the semiconductor device 200 according to the present embodiment. In FIG. 10, between depletion layers formed in the p-well region 14 and a pn junction between the drift layer 12 and the electric field relaxation region 40, an equipotential line of a depletion layer at the side of the drift layer 12 and the electric field relaxation region 40 is denoted by a dotted line.

In the present embodiment, the n-type electric field relaxation region 40 which is in contact with the bottom of the trench 18 and the drift layer 12 is provided under the trench 18, that is, between the bottom of the trench 18 and the drift layer 12.

In addition, the drift layer 12 and the electric field relaxation region 40 are directly in contact with each other at the upper side of the drift layer 12 such that the voltage of the drift layer 12 is applied to the electric field relaxation region 40.

By this configuration, even when a bias voltage is applied between the gate electrode 24 and the drain electrode 28, a depletion layer is formed from the side of the p-well region 14, that is, the side surface side of the electric field relaxation region 40 to the n-type electric field relaxation region 40 such that the potential of the bottom of the trench 18 is increased and the electric field applied to the gate insulating film 22 is decreased. Accordingly, insulation breakdown tolerance of the gate insulating film 22 is improved and increase in leakage current is suppressed.

Figure 11:
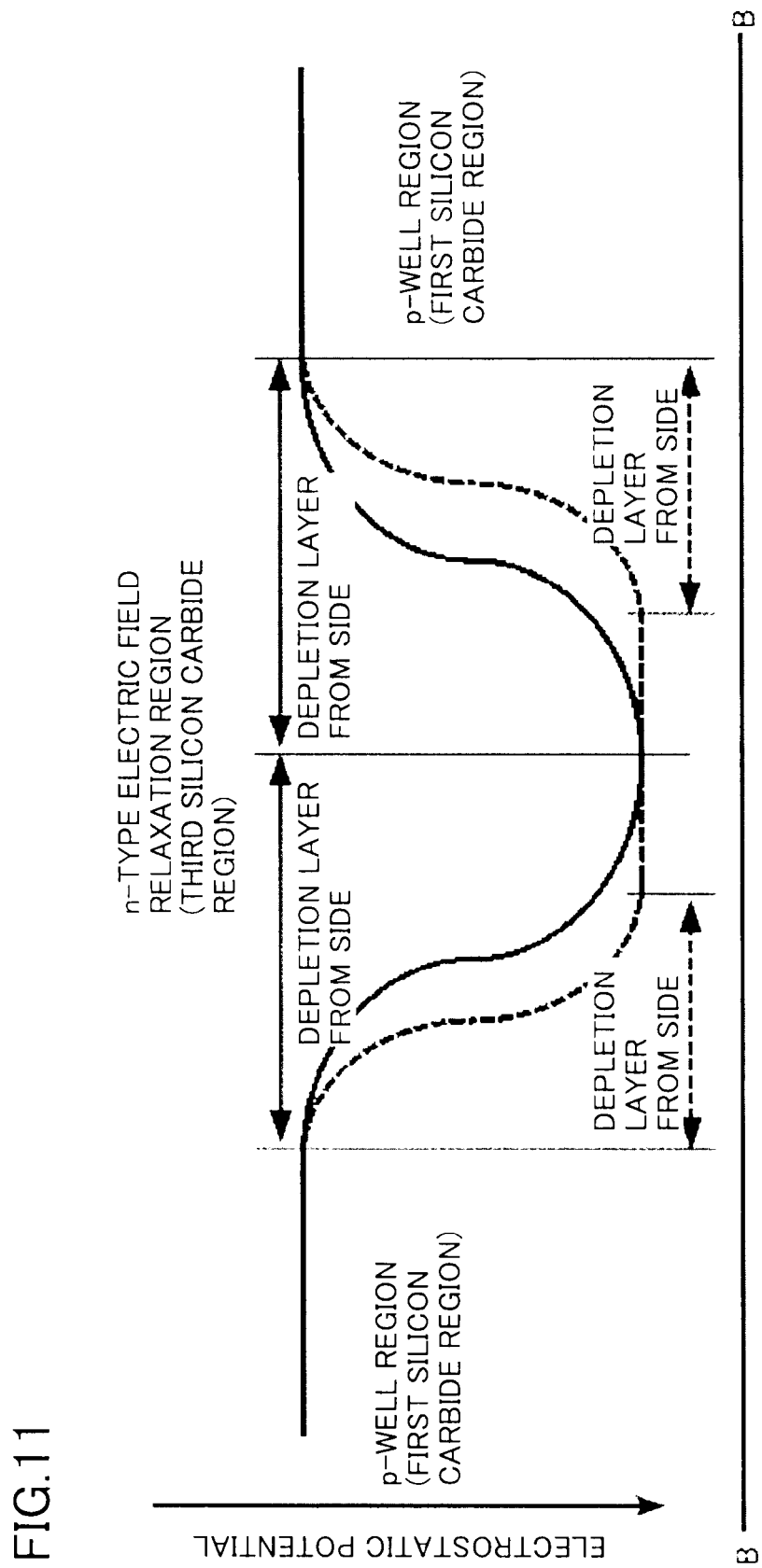
FIG. 11 is a diagram illustrating a potential distribution taken along line B-B of FIG. 9A.

FIG. 11 is a diagram illustrating a potential distribution taken along line B-B of FIG. 9A. A dotted line of the drawing illustrates the potential of a lower end of a conduction band in the case in which depletion layers grown from both side surfaces of the electric field relaxation region 40 to the bottom of the trench 18 are not in contact with each other at the bottom of the trench 18. A solid line of the drawing illustrates the potential of a lower end of a conduction band in the case in which depletion layers grown from both side surfaces of the electric field relaxation region 40 to the bottom of the trench 18 are in contact with each other at the bottom of the trench 18.

From the viewpoint of relaxation of the electric field applied to the entire gate insulating film 22 of the bottom of the trench 18, the depletion layers grown from both side surfaces of the electric field relaxation region 40 to the bottom of the trench 18 are preferably in contact with each other at the bottom of the trench 18. This is because, when a region in which the depletion layers are not in contact with each other is present, the electric field applied to the gate insulating film 22 of that region is not relaxed.

Since the depletion layers grown from both side surfaces of the electric field relaxation region 40 are in contact with each other, the width w (see FIG. 9A) of the bottom of the trench 18 preferably satisfies Equation 2 as follows in a thermal equilibrium state, that is, a zero bias between the electric field relaxation region and the p-well region.

$$w \leq 2 \times (2\in_s \phi bi Na/qNd(Na+Nd))^{1/2} \qquad \text{Equation 2}$$

where, $\phi bi=(kT/q)\times \ln(NdNa/Ni^2)$, Nd denotes an impurity concentration of the electric field relaxation region (third silicon carbide region), Na denotes an impurity concentration of the p-well region (first silicon carbide region), ni denotes intrinsic carrier density, q denotes an elementary charge, T denotes an absolute temperature, k denotes a Boltzmann constant, and $\in_s$ denotes a dielectric constant of silicon carbide.

The right side of the inequality illustrates a length which is twice the width of the depletion layer grown from the side of the p-well region 14 to the electric field relaxation region 40. If Equation 2 is satisfied in the thermal equilibrium state, even when a voltage is applied between the electric field relaxation region 40 and the p-well region 14, the depletion layer is further grown. Thus, it is assured that the depletion layers grown from both side surfaces of the electric field relaxation region 40 to the bottom of the trench 18 are in contact with each other at the bottom of the trench.

In addition, Nd represents the maximum impurity concentration of the electric field relaxation region (third silicon carbide region) 40 and Na represents the maximum impurity concentration of the p-well region (first silicon carbide region) 14.

The n-type impurity concentration of the electric field relaxation region (third silicon carbide region) 40 is preferably low, from the viewpoint of that the depletion layer grown from both side surfaces of the electric field relaxation region 40 to the bottom of the trench 18 are easily in contact with the bottom of the trench 18. The n-type impurity concentration of the electric field relaxation region (third silicon carbide region) 40 is preferably lower than the n-type impurity concentration of the drift layer (silicon carbide layer) 12.

If the n-type impurity concentration is too low, it is not preferable that parasitic resistance of the drain side is too increased when the MOSFET is turned on. From this viewpoint, the n-type impurity concentration is $1 \times 10^{15}$ cm$^3$ or more.

From the viewpoint of suppressing punch-through of the source region 16 and the electric field relaxation region 40, the depth d (see FIG. 9A) of the trench 18 deeper than the source region 16 preferably satisfies Equation 3 as follows under a bias condition of the OFF state of the MOSFET.

$$d > (2\in_s(\phi bi+V)Nd/qNa(Na+Nd))^{1/2} \qquad \text{Equation 3}$$

where, $\phi bi=(kT/q)\times \ln(NdNa/ni^2)$, Nd denotes an impurity concentration of the electric field relaxation region (third silicon carbide region) 40, Na denotes an impurity concentration of the p-well region (first silicon carbide region) 14, ni denotes intrinsic carrier density, q denotes an elementary charge, T denotes an absolute temperature, k denotes a Boltzmann constant, and $\in_s$ denotes a dielectric constant of silicon carbide.

The right side of the inequality illustrates a length which corresponds to the width of the depletion layer grown from the side of the p-well region 14 from the side of the electric field relaxation region 40 to the side of the source region 16.

If Equation 3 is satisfied, punch-through between the source region and the electric field relaxation region in the OFF state of the MOSFET is suppressed.

As described above, according to the semiconductor device 200 of the present embodiment, by providing the n-type electric field relaxation region 40 beneath the trench 18, the depletion layer is formed from the side of the p-well region 14 in the electric field relaxation region 40. Accordingly, the electric field applied to the gate insulating film 22 is reduced as compared to the case in which the electric field relaxation region 40 is not provided. Therefore, the withstand voltage of the gate insulating film 22 is improved and the leakage current of the gate insulating film 22 is also reduced. Reliability of the gate insulating film 22 is also improved.

Fourth Embodiment

The present embodiment is an example of the method of manufacturing the semiconductor device 200 of the third embodiment. FIGS. 12 to 16 are cross-sectional views illustrating the method of manufacturing the semiconductor device of the present embodiment. Hereinafter, the present embodiment will be described with reference to FIGS. 12 to 16. The overlapped portion with the second embodiment will not be repeated.

Figure 12:
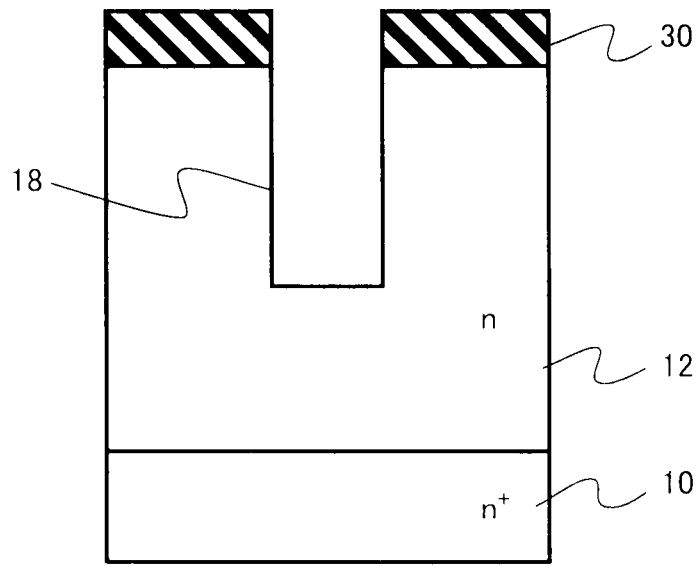
FIG. 12 is a cross-sectional view illustrating a method of manufacturing a semiconductor device according to a fourth embodiment.

First, as illustrated in FIG. 12, an n-type drift layer (silicon carbide layer) 12 is formed on a first main surface of an n-type silicon carbide substrate 10 having first and second main surfaces by epitaxial growth. The n-type silicon carbide substrate 10 becomes a drain layer 10. The drift layer 12 has, for example, a thickness of about 5 to 10 μm.

For example, a mask material 30 of a silicon nitride film is deposited and patterned on the n-type drift layer (silicon carbide layer) 12. A trench 18 is formed using this mask material 30 as a mask, for example, by a reactive ion etching (RIE) method.

Figure 13:
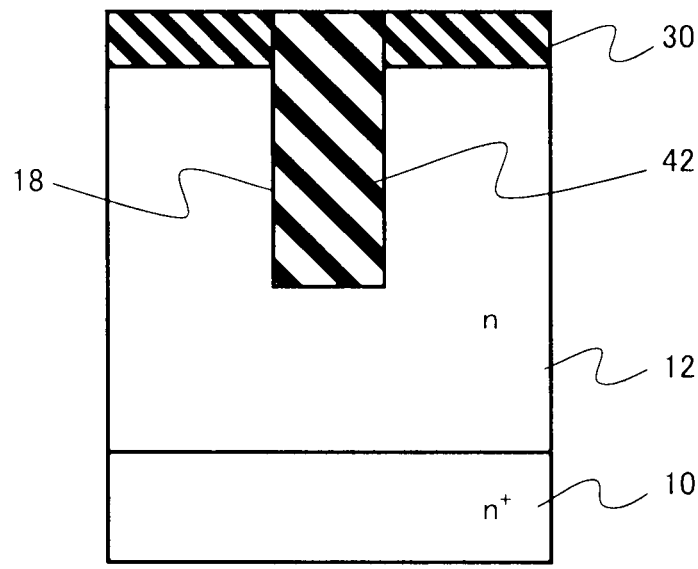
FIG. 13 is a cross-sectional view illustrating the method of manufacturing the semiconductor device according to the fourth embodiment.

Next, as illustrated in FIG. 13, a buried material 42 having a high ion prevention function upon ion implantation as compared to silicon carbide, for example, a silicon nitride film is buried in the trench 18. The ion prevention function of the silicon nitride film upon ion implantation is higher than that of silicon carbide by a multiple of about 1.3. In addition, if the buried material has the low ion prevention function upon ion implantation as compared to silicon carbide, a buried material other than the silicon nitride film may be used.

Figure 14:
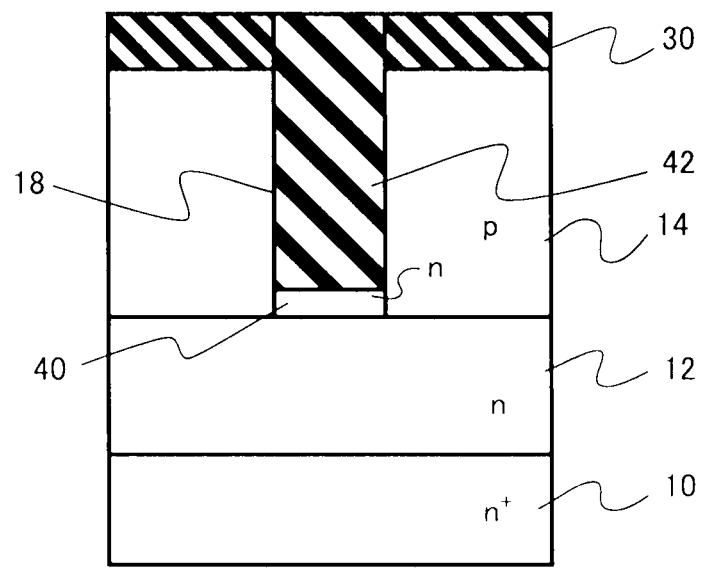
FIG. 14 is a cross-sectional view illustrating the method of manufacturing the semiconductor device according to the fourth embodiment.

Next, as illustrated in FIG. 14, p-type impurities, for example, aluminum (Al) are ion-implanted into the drift layer (silicon carbide layer) 12 so as to form a p-well region (first silicon carbide region) 14. An ion implantation condition is set such that the depth of the p-well region 14 is deeper than that of the trench 18.

Ion implantation is preferably performed at a high temperature of 300° C. to 600° C. such that crystalline of silicon carbide does not deteriorate. Ion implantation for forming the p-well region 14 may be performed several times by changing the depth.

Upon ion implantation, the buried material 42 having the high ion prevention function upon ion implantation as compared to silicon carbide is buried in the trench 18. Thus, introduction of p-type impurities is completely or partially prevented in the bottom of the trench 18. Accordingly, simultaneously with or in a manner of being self-aligned with the p-well region (first silicon carbide region) 14, an n-type electric field relaxation region (third silicon carbide region) 40 is formed. The electric field relaxation region 40 is formed to be interposed between the bottom of the trench and the drift layer (silicon carbide layer) 12 such that the side surfaces thereof are interposed by the p-well region (first silicon carbide region) 14.

The concentration of the electric field relaxation region 40 can be controlled, for example, by adjusting the amount of the buried material 42 in the trench 18. For example, if the amount of p-type impurities introduced into the bottom of the trench 18 is desired to be increased and the n-type concentration of the electric field relaxation region 40 is desired to be decreased under the same ion implantation condition, ion implantation is performed after removing the buried material 42 of the upper portion of the trench 18 by an etch-back process.

If the electric field relaxation region 40 having a desired prevention function of ion implantation of the p-type impurities is not sufficiently formed only using the buried material 42, a material which becomes a mask, for example, a silicon oxide film or a silicon nitride film may be patterned and formed on the buried material 42.

Figure 15:
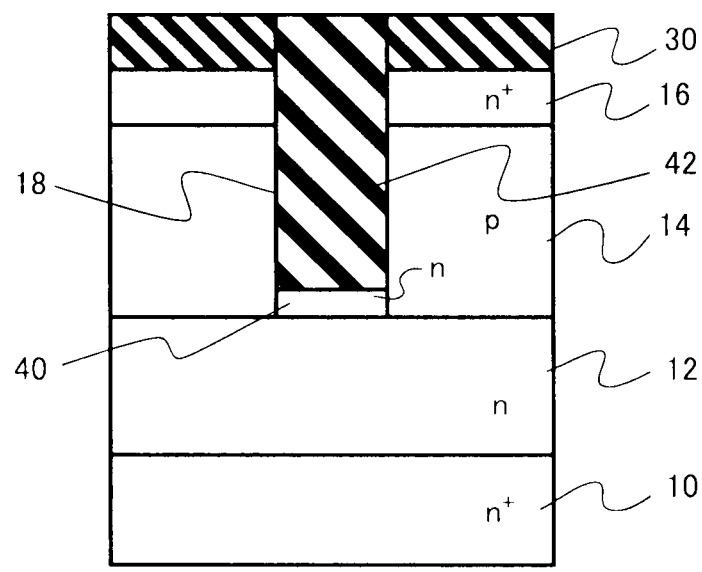
FIG. 15 is a cross-sectional view illustrating the method of manufacturing the semiconductor device according to the fourth embodiment.

Next, as illustrated in FIG. 15, n-type impurities, for example, nitrogen (N) are ion-implanted into the drift layer (silicon carbide layer) 12 so as to form an n-type source region (second silicon carbide region) 16 shallower than the p-well region (first silicon carbide region) 14. A distance between the electric field relaxation region 40 and the source region 16 becomes a channel length of the semiconductor device 200.

Figure 16:
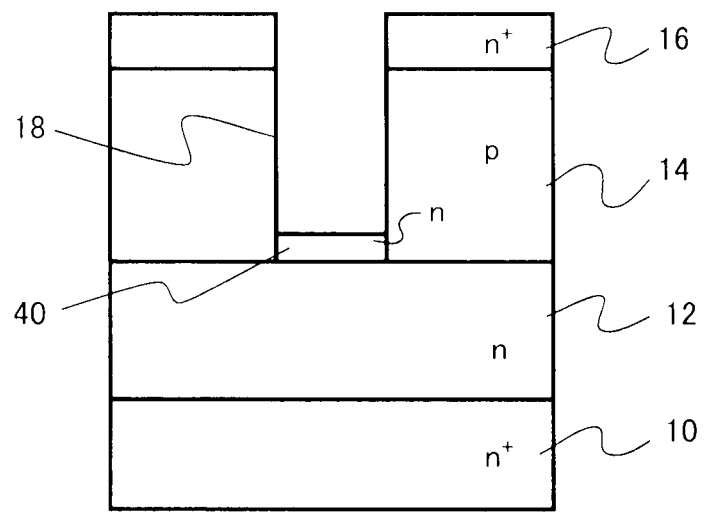
FIG. 16 is a cross-sectional view illustrating the method of manufacturing the semiconductor device according to the fourth embodiment.

Next, as illustrated in FIG. 16, the mask material 30 and the buried material 42 are stripped, for example, by wet etching. In addition, for example, an annealing process is performed at a temperature of 1700° C. to 1900° C. so as to activate impurities introduced by ion implantation.

Thereafter, for example, a gate insulating film 22 of a silicon oxide film is formed in the trench 18, for example, by a thermal oxidation method. In addition, polycrystalline silicon is deposited and patterned on the gate insulating film 22, for example, by a CVD method so as to form a gate electrode 24.

In addition, for example, after forming a protective insulating film (not illustrated), a contact hole is formed in the protective insulating film on the source region 16 (second silicon carbide region). In addition, a source electrode (first electrode) 26 is formed on the source region 16 (second silicon carbide region). A drain electrode (second electrode) 28 is formed on the second main surface of the drain layer 10.

By the above manufacturing method, the semiconductor device 200 illustrated in FIGS. 9A and 9B is manufactured. According to the method of manufacturing the semiconductor device of the present embodiment, the n-type electric field relaxation region (third silicon carbide region) 40 of the semiconductor device 200 illustrated in FIGS. 9A and 9B may be formed in few process steps in a self-aligned manner. Accordingly, it is possible to easily manufacture the semiconductor device in which the withstand voltage of the gate insulating film 22 is improved, leakage current of the gate insulating film 22 is reduced, and reliability of the gate insulating film 22 is improved.

In addition, according to the method of manufacturing the semiconductor device of the present embodiment, the n-type region having the uniform concentration is etched so as to form the trench 18. Accordingly, it is possible to suppress roughness of the side surface of the trench 18, improve reliability of the gate insulating film 22, and improve stability of a threshold due to suppression of mobility deterioration in a channel region.

In the above embodiments, a layer or a region formed by ion implantation may be formed by epitaxial growth.

While certain embodiments have been described, these embodiments have been presented by way of example only, and are not intended to limit the scope of the inventions.

Indeed, a semiconductor device and a method of manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first conductive type silicon carbide substrate having first and second surfaces;
   a first conductive type silicon carbide layer provided on the first surface of the silicon carbide substrate;
   a second conductive type first silicon carbide region provided on the silicon carbide layer;
   a first conductive type second silicon carbide region provided on the first silicon carbide region;
   a second conductive type third silicon carbide region provided selectively in the silicon carbide layer, the third silicon carbide region being in contact with the first silicon carbide region;
   a gate electrode provided in the second silicon carbide region, the first silicon carbide region, and the third silicon carbide region;
   a gate insulating film provided between the gate electrode and the second silicon carbide region, the gate insulating film provided between the gate electrode and the first silicon carbide region, the gate insulating film provided between the gate electrode and the third silicon carbide region;
   a first electrode provided on the second silicon carbide region; and
   a second electrode provided on the second main surface.

2. The semiconductor device according to claim 1, wherein an impurity concentration of the third silicon carbide region is lower than an impurity concentration of the first silicon carbide region.

3. The semiconductor device according to claim 1, wherein a thickness t of the third silicon carbide region on the side of the gate electrode satisfies Equation 1:

$$t \leq (2 \in s \phi bi Nd / q Na(Na+Nd))^{1/2}$$ Equation 1

(where, $\phi bi=(kT/q) \times \ln(NdNa/ni^2)$, Nd denotes an impurity concentration of the silicon carbide layer, Na denotes an impurity concentration of the third silicon carbide region, ni denotes intrinsic carrier density, q denotes an elementary charge, T denotes an absolute temperature, k denotes a Boltzmann constant, and ∈s denotes a dielectric constant of silicon carbide).

4. The semiconductor device according to claim 1, wherein the gate insulating film is a silicon oxide film.

5. A semiconductor device comprising:
   a first conductive type silicon carbide substrate having first and second surfaces;
   a first conductive type silicon carbide layer provided on the first surface of the silicon carbide substrate;
   a second conductive type first silicon carbide region provided on the silicon carbide layer;
   a first conductive type second silicon carbide region provided on the first silicon carbide region;
   a gate electrode provided in the second silicon carbide region and the first silicon carbide region;
   a gate insulating film provided between the gate electrode and the second silicon carbide region, the gate insulating film provided between the gate electrode and the first silicon carbide region;
   a first conductive type third silicon carbide region provided selectively in the first silicon carbide region, the third silicon carbide region being in contact with the silicon carbide layer, the third silicon carbide region provided between the silicon carbide layer and the gate insulating film;
   a first electrode provided on the second silicon carbide region; and
   a second electrode provided on the second main surface.

6. The semiconductor device according to claim 5, wherein a width w of the gate electrode with the gate insulating film satisfies Equation 2:

$$w \leq 2 \times (2 \in s \phi bi Na / q Nd(Na+Nd))^{1/2}$$ Equation 2

(where, $\phi bi=(kT/q) \times \ln(NdNa/ni^2)$, Nd denotes an impurity concentration of the third silicon carbide region, Na denotes an impurity concentration of the first silicon carbide region, ni denotes intrinsic carrier density, q denotes an elementary charge, T denotes an absolute temperature, k denotes a Boltzmann constant, and ∈s denotes a dielectric constant of silicon carbide).

7. The semiconductor device according to claim 5, wherein the gate insulating film is a silicon oxide film.

* * * * *